Feb. 4, 1969 ER-CHUN-HO 3,426,300

CRYSTAL FILTER ARRAY

Filed Sept. 3, 1965 Sheet 1 of 2

INVENTOR.
ER-CHUN-HO,
BY Paul M. Coble
ATTORNEY.

INVENTOR.
ER-CHUN-HO,
BY
Paul M. Coble
ATTORNEY.

United States Patent Office 3,426,300

Patented Feb. 4, 1969

3,426,300

CRYSTAL FILTER ARRAY

Er-Chun Ho, Newport Beach, Calif., assignor to Hughes Aircraft Company, Culver City, Calif., a corporation of Delaware Filed Sept. 3, 1965, Ser. No. 484,899

U.S. Cl. 333—72 7 Claims

Int. Cl. H01p *1/20*

ABSTRACT OF THE DISCLOSURE

A crystal filter comb is disclosed comprising a plurality of crystal filter channels having respective frequency passbands covering substantially contiguous predetermined frequency ranges. Each channel includes a pair of crystal resonators each having first and second electrodes. A bifilar transformer applies an input signal between the first electrode of each odd numbered resonator and the first electrode of each even numbered resonator in the comb. The second resonator electrodes of each pair of resonators are coupled to a filter channel load terminal. The series resonant frequencies of the pair of resonators in each channel are made to the upper and lower cut-off frequencies, respectively, for the channel.

This invention relates to crystal filters, and more particularly relates to an arrangement of crystal filters in a unique contiguous comb configuration which achieves maximum power efficiency in a minimum amount of space.

In certain instances it is necessary to sample a varying frequency input signal and to determine in what relatively narrow portion of the input signal frequency excursion range the input signal resides at a given instant in time. For this purpose it has been the practice to feed such an input signal into an array of a large number of crystal filters in which the respective crystal filters have relatively narrow, sharply defined, and substantially contiguous frequency passbands throughout the input signal frequency excursion range. Such an array of crystal filters is often termed a "contiguous comb."

In order to prevent excessive interference between successive conventionally designed symmetrical lattice crystal filters in a contiguous comb, isolation resistors have been inserted between the input signal source and the input to each filter. However, these isolation resistors give rise to substantial power dissipation so that the overall power efficiency of such a contiguous crystal filter comb is quite low.

Accordingly, it is an object of the present invention to provide a contiguous crystal filter comb which is able to operate with substantially higher power efficiencies than has heretofore been achievable.

It is a further object of the present invention to provide a highly efficient contiguous crystal filter comb which, for a comparable number of similar characteristic filter channels, is considerably more compact and lighter than prior art arrangements, thereby affording substantial savings in size and weight.

It is a still further object of the present invention to provide a micro-miniaturized contiguous crystal filter comb which is highly compatible with other microelectronic circuitry which might be used in the overall system incorporating the filter comb.

In accordance with the foregoing objects, the present invention provides a crystal filter network comprising a plurality of crystal filter channels having respective frequency passbands covering substantially contiguous predetermined frequency ranges. Each channel includes first and second crystal resonators each having first and second electrodes, with the second resonator electrodes of each channel being coupled together. A first electrical conductor is coupled to the first electrodes of each of the first crystal resonators, while a second electrical conductor is coupled to the first electrodes of each of the second crystal resonators. Means are provided for applying an input signal between the first and second conductors, and loading means are coupled to the second resonator electrodes of each filter channel.

In one embodiment of the present invention each crystal resonator is formed in a separate quartz crystal having a pair of opposite broad faces, and the first and second electrodes comprise respective metal coatings on at least partially aligned portions of the opposite broad faces.

In another embodiment of the invention all of the resonators are formed in a single elongated quartz slab having a progressively increasing thickness as a function of distance from one end.

Additional objects, advantages and characteristic features of the invention will become readily apparent from the following detailed description of preferred embodiments thereof when considered in conjunction with the accompanying drawings in which.

Figure 1:
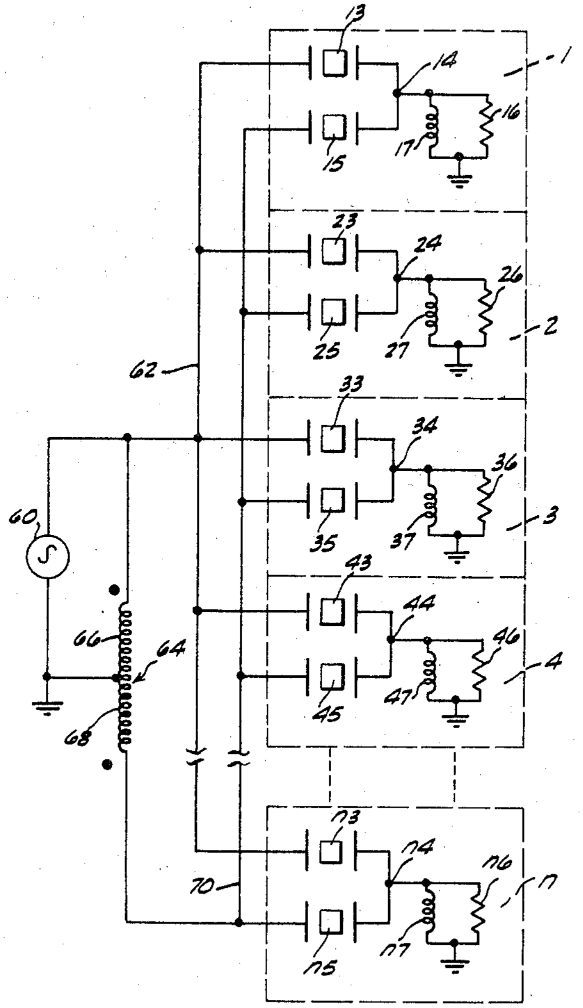
FIG. 1 is a schematic circuit diagram illustrating a contiguous crystal filter comb according to the present invention.
Figure 2:
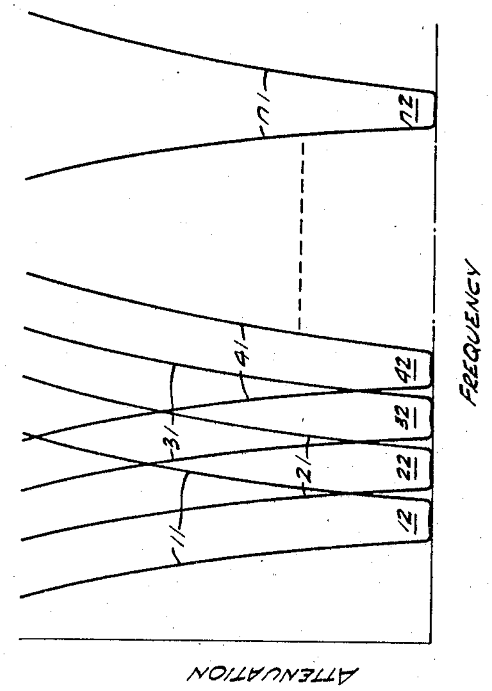
FIG. 2 is a graph illustrating the overall attenuation vs. frequency characteristics of the filter comb of FIG. 1.

Referring to FIG. 1 with greater particularity, a contiguous crystal filter comb according to the present invention may be seen to include a plurality of crystal filters respectively designated as 1, 2, 3, 4 . . . *n*. It should be understood, of course, that the number of filters shown is purely illustrative and in practice would be determined by particular system requirements, usually being on the order of one hundred or more. Each of the crystal filters 1, 2, 3, 4 . . . *n* provides heavy attenuation for signals at all frequencies except for those falling within the sharply defined frequency passband of the filter, with the respective frequency passbands of the various filters covering relatively narrow substantially contiguous predetermined frequency ranges throughout a much wider overall frequency range. As may be seen from FIG. 2, the attenuation vs. frequency characteristic of the filter 1 is illustrated by the lines 11; the attenuation vs. frequency characteristic of the filter 2 is shown by the lines 21; and the attenuation vs. frequency characteristics of the filters 3, 4 and *n* are depicted by the respective lines 31, 41 and *n*1. Thus, the respective filters 1, 2, 3, 4 and *n* provide frequency passbands 12, 22, 32, 42 and *n*2.

The contiguous crystal filter comb consisting of the respective fillers 1, 2, 3, 4 . . . *n* is driven from an input signal source 60 which furnishes an AC voltage capable of varying in frequency over the overall frequency response range of the filter comb. The source 60 should have as small a series internal impedance as possible, theoretically approaching zero ohms. One terminal of the voltage source 60 is connected to a first signal lead 62, while the other terminal of the source 60 is connected to a level of reference potential designated as ground in FIG. 1. A bifilar transformer 64 has first and second windings 66 and 68, respectively, connected in series between the first signal lead 62 and a second signal lead 70, with the junction between the windings 66 and 68 connected to the ground level. The phase relationship between signals in the first and second transformer windings 66 and 68 is indicated in the conventional manner by the dots adjacent the transformer windings.

Each of the crystal filters 1, 2, 3, 4 . . . *n* are of the same configuration, except that the resonant frequencies of the resonators in the various filters are made slightly different in the manner to be described more fully below so that the various filters have the aforementioned different frequency passbands. Therefore, the configuration and design of the crystal filter 1 will be described in detail for purposes of illustration, it being understood that the other fillers are arranged and designed in the same manner.

The crystal filter 1 comprises a first quartz crystal 13 connected between the first signal lead 62 and a terminal 14 and a second quartz crystal 15 connected between the second signal lead 70 and the terminal 14. A load resistor 16 is connected between the terminal 14 and ground, and an inductor 17 may be connected in parallel with the resistor 16 to neutralize the shunt capacitance of the crystals 13 and 15 (as well as any stray capacitance between the terminal 14 and ground) at a frequency essentially equal to the center frequency of the passband of the filter 1. However, such neutralization may not be necessary for filters having passbands sufficiently narrow so that crystal parallel resonances do not degrade the attenuation characteristic in the vicinity of the filter passband. The remaining filters 2, 3, 4 . . . *n* contain the same components as does the filter 1, with corresponding components in the filters 2, 3, 4 . . . *n* bearing the same second reference numeral digit as their counterpart elements in the filter 1 and the first reference numeral digit indicating the particular filter in which the component is located.

Figure 4:
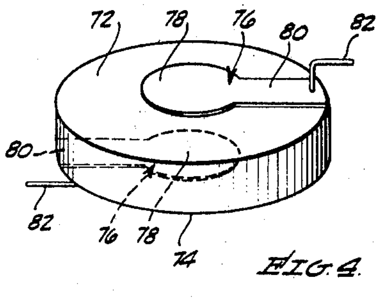
FIG. 4 is a perspective view of an exemplary individual crystal which may be used in the filter comb of FIG. 1 in accordance with one embodiment of the present invention.

An exemplary crystal which may be used for each of the crystals 13, 15 . . . *n*3, *n*5 in the filter comb of FIG. 1 is illustrated in FIG. 4 as an AT cut quartz crystal. It should be understood, however, that other crystal cuts, for example but not being limited to BT, CT, DT, X and SL cuts, may be used instead. As is shown in FIG. 4, the crystal has a pair of opposing broad faces 72 and 74 of circular geometry, with an electrode coating 76 being disposed on each of the crystal faces 72 and 74. Each coating 76, which may be of a metal such as silver, is of a keyhole geometry having a substantially circular portion 78 covering the central region of the broad crystal face on which it is disposed and an elongated rectangular portion 80 extending from the perimeter of the circular portion 78 to the edge of the crystal. The central coating portions 78 on the opposite crystal faces 72 and 74 are aligned with one another, while the rectangular coating portions extend radially outwardly from the respective circular portions 78 in diametrically opposite directions. Electrical leads 82 are soldered or otherwise attached to the respective rectangular coating portions 80 near the edge of the crystal. Each crystal is mounted in a hermetically sealed container (not shown).

Figure 3:
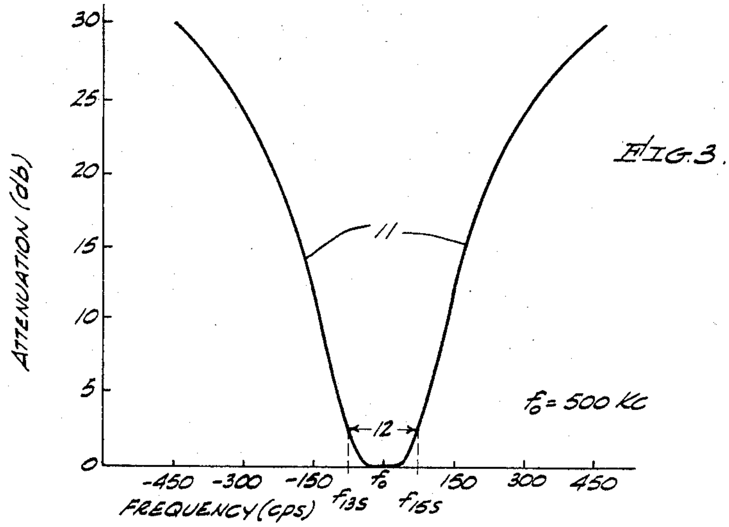
FIG. 3 is a graph depicting the attenuation vs. frequency characteristic of a typical individual crystal filter in the comb of FIG. 1.

In order to better explain the manner in which the crystal filter passbands are determined, the attenuation vs. frequency characteristic 11 for the crystal filter 1 is shown by itself in FIG. 3. The crystal 13 is made to have a series resonant frequency $f_{13s}$ at a frequency in the vicinity of the lower extremity of the frequency passband 12 of the filter 1 and at which frequency the attenuation provided by the filter 1 is a predetermined amount (for example 2.5 db) above its minimum level. Similarly, the series resonant frequency $f_{15s}$ of the crystal 15 is made to occur at a frequency which provides the same level of attenuation as that for the series resonant frequency $f_{13s}$, but in the vicinity of the upper edge of the passband 12.

The series resonant frequency of a quartz crystal is inversely proportional to the square root of the product of the crystal series capacitance and the crystal series inductance. Preferably, each of the crystals 13, 15 . . . *n*3, *n*5 in the filter comb is designed to have approximately the same series capacitance, and the variation in series resonant frequency between the respective crystals is accomplished by varying the series inductance. Variation of the crystal series inductance may be accomplished by altering the crystal thickness (including the thickness of the electrode coating) so that a decrease in crystal thickness results in an increase in the crystal series resonant frequency.

In the exemplary filter passband characteristic illustrated in FIG. 3, the passband center frequency $f_0$ occurs at 500 kc., and the respective series resonant frequencies $f_{15s}$ and $f_{13s}$ occur at 75 c.p.s. above and below the center frequency $f_0$, thereby providing a frequency passband 12 of 150 c.p.s. It may be observed from FIG. 3 that the level of attenuation at the frequencies $f_{15s}$ and $f_{13s}$ is 2.5 db above the attenuation level at the center frequency $f_0$, and the attenuation increases to at least 30 db above its level at $f_0$ for frequencies 450 c.p.s. above and below the center frequency $f_0$.

Figures 5, 6:
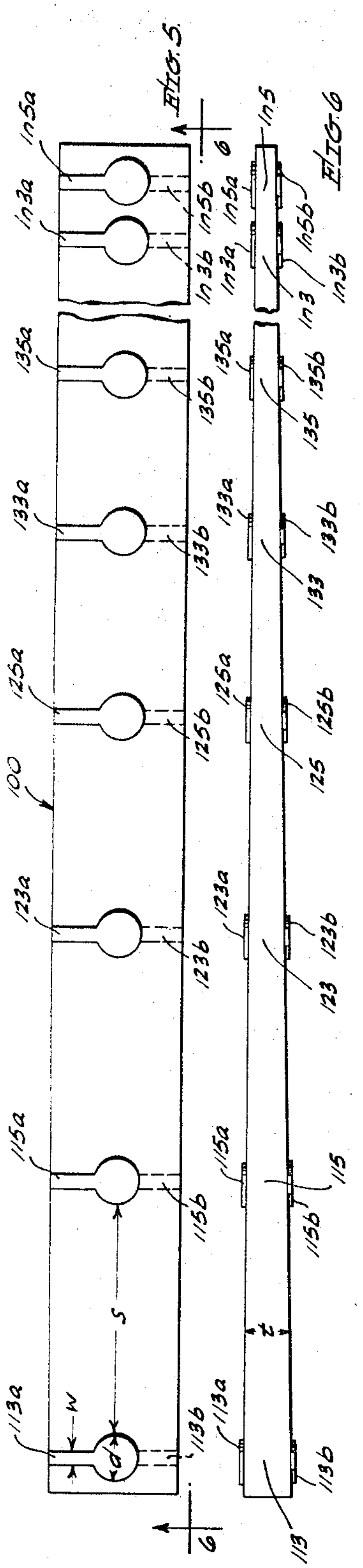
FIG. 5 is a plan view of the crystal portion of a contiguous crystal filter comb in accordance with a further embodiment of the invention.
FIG. 6 is a side view taken along line 6—6 of FIG. 5.

In a further embodiment of the present invention, illustrated in FIGS. 5 and 6, instead of fabricating each crystal 13 . . . *n*5 as a separate wafer such as illustrated in FIG. 4, all of the resonators required in the comb may be fabricated in a single elongated AT cut quartz slab 100. As may be seen from FIG. 6, the slab 100 is tapered to provide a progressively increasing thickness as a function of distance from one end and thereby gradually decrease the resonant frequency. A plurality of resonators 113, 115, 123, 125, 133, 135 . . . 1*n*3, 1*n*5 (which function similarly to the respective crystals 13 . . . *n*5 of FIG. 1) may be provided in different longitudinal regions of the slab 100 by plating keyhole-like metal electrode coatings 113*a*, 113*b*, 115*a*, 115*b*, 123*a*, 123*b*, 125*a*, 125*b*, 133*a*, 133*b*, 135*a*, 135*b* . . . 1*n*3*a*, 1*n*3*b*, 1*n*5*a*, 1*n*5*b* on opposite broad faces of the quartz slab 100 adjacent the regions where the respective resonators are to be formed.

As is shown in FIG. 5, the electrode coatings bearing the suffix *a* are located on one broad face of the slab 100, while the electrode coatings designated with the suffix *b* are disposed on the opposite broad face. The two electrodes for each resonator have aligned circular portions, and each electrode also has a substantially rectangular portion which extends outwardly from the perimeter of the circular portion. The rectangular portions of the electrodes designated *a* extend in one transverse direction to one edge of the slab, while the rectangular portions of the *b* electrodes extend in the opposite transverse direction to the opposite slab edge. The longitudinal spacing *s* between successive electrodes on the same slab face should be greater than a critical distance which is proportional to the slab thickness *t* in the region between the electrodes in question in order to prevent undesired coupling between the various resonators in the slab. Each successive pair of longitudinally adjacent resonators 113–115, 123–125, etc. may form a filter channel having its frequency passband defined in the same manner as described above with respect to FIG. 3.

When the tapered quartz slab 100 of FIGS. 5 and 6 is used to replace the various individual crystals 13 . . . *n*5 of FIG. 1, the alternate resonator electrodes 113*a*, 123*a*, 133*a* . . . 1*n*3*a* on one slab face may be connected to the first input signal lead 62; the other alternate resonator electrodes 115*a*, 125*a*, 135*a* . . . 1*n*5*a* on the same slab face may be connected to the second input signal lead 70; while on the opposite slab face the resonator electrodes 113*b* and 115*b* may be connected to the junction point 14, the electrodes 123*b* and 125*b* to the junction point 24, the electrodes 133*b* and 135*b* to the junction point 34, and the electrodes 1*n*3*b* and 1*n*5*b* to the junction point *n*4. The electrical conductors interconnecting the various electrodes may consist of metal coating strips deposited onto the surface of the slab 100.

In an exemplary design of a contiguous crystal filter comb according to the embodiment of FIGS. 5 and 6, the slab 100 may have a length of 14 inches, a width of 0.2 inch, and a center thickness of 0.00443 inch. The slab thickness at the end adjacent the resonator 113 (i.e., at the low frequency end) may be 0.00458 inch, while the slab thickness at the end adjacent the resonator **1*n*5**(i.e., at the high frequency end) may be 0.00428 inch. Such a slab could contain one hundred pairs of electrodes in which the circular electrode portions have a diameter *d* of 0.06 inch and the rectangular electrode portions have a width *w* of 0.02 inch, with the longitudinal spacing *s* between successive electrodes on the same slab face being at least 18 times the slab thickness *t* in the region between the electrodes in question. A multiple-electrode crystal filter slab fabricated in accordance with the foregoing dimensions could provide 50 contiguous filter channels, each having a passband of 20 kc., covering an overall frequency range between essentially 14.5 mc. and 15.5 mc.

It should be apparent that since no isolation resistors are required at the inputs to each of the filter channels 1, 2, 3, 4 . . . *n*, a contiguous crystal filter comb is provided which can operate with substantially higher power efficiencies than in the past. Moreover, since all of the filter channels share a single input transformer, the present invention provides a contiguous crystal filter comb which is considerably more compact and lighter than comparable arrangements of the prior art. When the crystal resonators are all formed on a single slab in accordance with the embodiment of FIGS. 5 and 6, further savings in size and weight are afforded, and in addition, the resultant contiguous crystal filter comb is highly compatible with other micro-electronic circuitry which may be used in the overall system incorporating the filter comb.

Although the invention has been shown and described with reference to particular illustrative embodiments, nevertheless, various changes and modifications obvious to a person skilled in the art to which the invention pertains is deemed to lie within the purview of the invention.

What is claimed is:

1. A crystal filter network comprising: a plurality of crystal filter channels having respective frequency passbands covering substantially contiguous predetermined frequency ranges, each channel including first and second crystal resonators each having first and second electrodes, the second resonator electrodes of each channel being coupled together, one of the resonators in each channel having a series resonant frequency in the vicinity of one extremity of the associated channel passband and at which an attenuation level a predetermined amount above the minimum attenuation level of the channel passband is provided, the other resonator in each channel having a series resonant frequency at a frequency in the vicinity of the other extremity of the channel passband at which said attenuation level is provided, first and second electrical conductors, said first conductor being coupled to the first electrodes of each of said first crystal resonators, said second conductor being coupled to the first electrodes of each of said second crystal resonators, means for applying an input signal between said first and second conductors, and loading means coupled to the second resonator electrodes of each filter channel.

2. A crystal filter network according to claim 1 wherein each crystal resonator is formed in a separate quartz crystal having a pair of opposite broad faces, and said first and second electrodes comprise respective metal coatings on at least partially aligned portions of said opposite broad faces.

3. A contiguous crystal filter comb of a plurality of crystal filter channels having respective frequency passbands covering substantially contiguous predetermined frequency ranges comprising: a plurality of pairs of quartz crystals, each crystal having first and second electrodes, the second electrodes of each pair of crystals being connected together; first and second electrical conductors, said first conductor being connected to the first electrodes of one of the crystals of each pair, said second conductor being connected to the first electrodes of the other crystal of each pair; one of the crystals of each pair having a series resonant frequency at a frequency in the vicinity of one extremity of a filter channel passband and at which an attenuation level a predetermined amount above the minimum attenuation level of the channel passband is provided; the other crystal of each pair having a series resonant frequency at a frequency in the vicinity of the other extremity of said filter channel passband at which said attenuation level is provided; first and second terminals for receiving an input signal, said first terminal being connected to said first conductor; a bifilar transformer having a first winding connected between said first and second terminals and having a second winding connected between said second conductor and said second terminal; and a resistance and an inductance connected in parallel between said second terminal and the respective interconnected second electrodes of each pair of crystals.

4. A crystal filter network comprising: a plurality of crystal filter channels having respective frequency passbands covering substantially contiguous predetermined frequency ranges, each channel including first and second crystal resonators each having first and second electrodes, the second resonator electrodes of each channel being coupled together, all of said resonators being formed in a single elongated slab of quartz, said slab having a proressively increasing thickness as a function of distance from one end, first and second electrical conductors, said first conductor being coupled to the first electrodes of each of said first crystal resonators, said second conductor having coupled to the first electrodes of each of said second crystal resonators, means for applying an input signal between said first and second conductors, and loading means coupled to the second resonator electrodes of each filter channel.

5. A crystal filter network comprising: a plurality of crystal filter channels having respective frequency passbands covering substantially contiguous predetermined frequency ranges, each channel including first and second crystal resonators each having first and second electrodes, the second resonator electrodes of each channel being coupled together, succesive ones of said resonators being formed in different longitudinal regions of a single elongated slab of quartz having a pair of opposite broad faces, said slab being tapered in thickness to provide a progressively increasing separation between said broad faces as a function of longitudinal distance along said slab, the electrodes of each resonator comprising respective metal coatings on at least partially aligned portions of said opposite broad faces, the longitudinal separation between each pair of longitudinally adjacent resonator electrodes being a predetermined times greater than the slab thickness in the region between said pair of longitudinally adjacent electrodes, first and second electrical conductors, said first conductor being coupled to the first electrodes of each of said first crystal resonators, said second conductor being coupled to the first electrodes of each of said second crystal resonators, means for applying an input signal between said first and second conductors, and loading means coupled to the second resonator electrodes of each filter channel.

6. A crystal filter network according to claim 5 wherein said metal coatings have substantially circular portions respectively covering the aligned portions of said opposite broad faces and have substantially rectangular portions respectively extending in essentially opposite transverse directions from the perimeter of the said circular portion to the edge of said slab.

7. A contiguous crystal filter comb comprising: an elongated tapered quartz element successively defining a plurality of resonators in different longitudinal regions thereof, first and second electrodes contacting each of said regions, a first electrical conductor connected to longitudinally alternate ones of said first electrodes, a second electrical conductor connected to the other longitudinally alternate ones of said first electrodes, first and second terminals for receiving an input signal, said first terminal being connected to said first conductor, a bifilar transformer having a first winding connected between said first and second terminals and having a second winding connected between said second conductor and said second terminal, successive longitudinally adjacent pairs of said resonators forming filter channels having respective frequency passbands covering substantially contiguous predetermined frequency ranges, one of the resonators of each of said pairs having a series resonant frequency at a frequency in the vicinity of one extremity of the associated filter channel passband and at which an attenuation level a predetermined amount above the minimum attenuation level of the channel passband is provided, the other resonator of each said pair having a series resonant frequency at a frequency in the vicinity of othe other extremity of said filter channel passband at which said attenuation level is provided, the second electrodes of successively longitudinally adjacent pairs of said regions being connected together, and a resistance and an inductance connected in parallel between said second terminal and the respective interconnected second electrodes of each said pair of regions.

References Cited

UNITED STATES PATENTS

| | | | |
|---|---|---|---|
| 3,054,968 | 9/1962 | Harrison | 331—76 |
| 3,170,120 | 2/1965 | Jensen | 330—117 |
| 2,859,346 | 11/1958 | Firestone et al. | 333—72 |
| 2,990,525 | 6/1961 | Grant | 333—72 |
| 3,295,051 | 12/1966 | Broadhead | 331—76 |
| 3,344,369 | 9/1967 | Bies | 333—72 |

ELI LIEBERMAN, *Primary Examiner.*

C. BARAFF, *Assistant Examiner.*

U.S. Cl. X.R.

331—76; 328—167